United States Patent
Ptak et al.

(10) Patent No.: US 11,177,402 B2
(45) Date of Patent: Nov. 16, 2021

(54) LIGHT SCATTERING STRUCTURES FOR THIN-FILM SOLAR CELLS AND METHODS OF MAKING THE SAME

(71) Applicant: Alliance for Sustainable Energy, LLC, Golden, CO (US)

(72) Inventors: Aaron Joseph Ptak, Littleton, CO (US); Kevin Louis Schulte, Denver, CO (US); John David Simon, Austin, TX (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/565,827

(22) Filed: Sep. 10, 2019

(65) Prior Publication Data

US 2020/0091354 A1    Mar. 19, 2020

Related U.S. Application Data

(60) Provisional application No. 62/732,858, filed on Sep. 18, 2018.

(51) Int. Cl.
| | | |
|---|---|---|
| *H01L 31/0236* | (2006.01) | |
| *H01L 31/18* | (2006.01) | |
| *H01L 31/0735* | (2012.01) | |
| *H01L 31/0445* | (2014.01) | |
| *H01L 31/054* | (2014.01) | |

(52) U.S. Cl.
CPC .... *H01L 31/02363* (2013.01); *H01L 31/0445* (2014.12); *H01L 31/0547* (2014.12); *H01L 31/0735* (2013.01); *H01L 31/186* (2013.01); *H01L 31/1844* (2013.01)

(58) Field of Classification Search
CPC ............ H01L 31/0687; H01L 31/0725; H01L 31/076; H01L 31/184–1856; H01L 31/0236–02363; H01L 31/0547; H01L 31/06–078

See application file for complete search history.

(56) References Cited

U.S. PATENT DOCUMENTS

| | | | | |
|---|---|---|---|---|
| 9,824,890 B2* | 11/2017 | Young | ..................... | C30B 25/08 |
| 10,192,740 B2* | 1/2019 | Young | ............... | H01L 21/02658 |
| 10,903,389 B2* | 1/2021 | Schulte | ............... | H01L 31/1844 |
| 2005/0242364 A1* | 11/2005 | Moustakas | .............. | H01L 33/22 |
| | | | | 257/103 |
| 2007/0120141 A1* | 5/2007 | Moustakas | .......... | H01L 31/1852 |
| | | | | 257/103 |
| 2011/0024722 A1* | 2/2011 | Moustakas | ........ | H01L 21/02389 |
| | | | | 257/13 |

(Continued)

OTHER PUBLICATIONS

Schulte, et al. "Development of GaInP solar cells grown by hydride vapor phase epitaxy." IEEE Journal of Photovoltaics 7.4 (2017): 1153-1158.*

(Continued)

*Primary Examiner* — William E McClain
(74) *Attorney, Agent, or Firm* — Michael A. McIntyre

(57) ABSTRACT

The present disclosure relates to a method that includes contacting a surface of a first layer that includes a Group III element and a Group V element with a gas that includes HCl, where the first layer is positioned in thermal contact with a wafer positioned in a chamber of a reactor, and the contacting results in a roughening of the surface.

13 Claims, 12 Drawing Sheets

(56) References Cited

U.S. PATENT DOCUMENTS

2019/0221705 A1* 7/2019 Schulte ............... C23C 16/448

OTHER PUBLICATIONS

Cabalu, et al. "Enhanced light extraction and spontaneous emission from textured GaN templates formed during growth by the HVPE method." In Proceedings—Electrochemical Society, pp. 351-357. Electrochemical Society, 2004.*

Smith, et al. "Development of back surface texture for light management in epitaxial lift off (elo) quantum dot solar cells." 2017 IEEE 44th Photovoltaic Specialist Conference (PVSC). IEEE, 2017.*

Simon, et al. "Upright and inverted single-junction GaAs solar cells grown by hydride vapor phase epitaxy." IEEE Journal of Photovoltaics 7.1 (2016): 157-161.*

Cabalu, et al. "Nitride LEDs based on flat and wrinkled quantum wells." Quantum sensing and nanophotonic devices II. vol. 5732. International Society for Optics and Photonics, 2005.*

Atwater, H. et al., "Plasmonics for improved photovoltaic devices," Nature Materials, vol. 9, Mar. 2010, 10 pages.

Ferry, V. et al., "Design Considerations for Plasmonic Photovoltaics," Advanced Materials, vol. 22, 2010, pp. 4794-4808.

Franken, R. H., "Understanding light trapping by light scattering textured back electrodes in thin film n-i-p-type silicon solar cells," Journal of Applied Physics, vol. 102, 2007, 7 pages.

Inoue, T. et al., "Enhanced Light Trapping in Multiple Quantum Wells by Thin-Film Structure and Backside Grooves With Dielectric Interface," IEEE Journal of Photovoltaics, vol. 5, No. 2, Mar. 2015, 7 pages.

Osborne, M., "Alta Devices sets new GaAs solar cell conversion efficiency record at 28.9%," www.pv-tech.org/news/alta-devices-sets-new-gaas-solar-cell-conversion-efficiency-record-at-28.9, accessed Nov. 20, 2019, 2 pages.

Schulte, K. et al., "Multijunction Ga0.5In0.5P/GaAs solar cells grown by dynamic hydride vapor phase epitaxy," Wiley Progress in Photovoltaics, Research Article, vol. 26, 2018, pp. 887-893.

Simon, J. et al., "Low-Cost III-V Solar Cells Grown by Hydride Vapor-Phase Epitaxy," IEEE 40th Photovoltaic Specialist Conference, Denver, Colorado 2014, 4 pages.

Wang, W. et al., "Design and development of back reflectors for improved light coupling and absorption enhancement in thin MQW solar cells," Proceedings of SPIE, SPIE 9358, Physics, Simulation, and Photonic Engineering of Photovoltaic Devices IV, 83580C, Mar. 16, 2015, 6 pages.

Xiao, J. et al., "Paths to light trapping in thin film GaAs solar cells," Optics Express A341, vol. 26, No. 6, Mar. 19, 2018, 11 pages.

* cited by examiner

LIGHT SCATTERING STRUCTURES FOR THIN-FILM SOLAR CELLS AND METHODS OF MAKING THE SAME

CROSS-REFERENCE TO RELATED APPLICATIONS

This application claims the benefit of U.S. Provisional Patent Application No. 62/732,858 filed Sep. 18, 2018, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

III-V solar cells have the highest efficiency of any solar cell technology, but their use is restricted to high-value markets such as satellites because of their high cost. One of the major contributors to the cost is the growth of the cell. Hydride vapor phase epitaxy (HVPE) has recently emerged as a low-cost growth technique, using lower cost precursors and faster growth rates; however, costs would be further reduced if the thickness of the solar cell could be reduced. Thus, there remains a need for manufacturing methods capable of producing III-V solar cells having reduced film thicknesses and reduced costs to enable III-V solar cells to enter more conventional application spaces.

SUMMARY

An aspect of the present disclosure is a method that includes contacting a surface of a first layer that includes a Group III element and a Group V element with a gas that includes HCl, where the first layer is positioned in thermal contact with a wafer positioned in a chamber of a reactor, and the contacting results in a roughening of the surface. In some embodiments of the present disclosure, the roughening may result in the surface having a roughness between 20 nm and 200 nm. In some embodiments of the present disclosure, the roughness may be between 20 nm and 30 nm. In some embodiments of the present disclosure, the first layer may include phosphorus. In some embodiments of the present disclosure, the first layer may further include at least one of gallium, indium, arsenic, and/or aluminum. In some embodiments of the present disclosure, the first layer may include at least one of GaInP, GaInAsP, AlGaInP, or AlGaInAsP.

In some embodiments of the present disclosure, the wafer may be maintained at a temperature between 650° C. and 800° C. In some embodiments of the present disclosure, a partial pressure of the HCl may be maintained at between 0.001 Torr and 1.0 Torr. In some embodiments of the present disclosure, the contacting may be maintained for a period of time between 10 seconds and 10 minutes.

In some embodiments of the present disclosure, the method may further include contacting HCL with a first liquid positioned in a first boat, resulting in the forming of a first intermediate gas, and contacting HCl with a second liquid positioned in a second boat, resulting in the forming of a second intermediate gas, where the first intermediate gas and the second intermediate gas interact, resulting in the depositing of the first layer on the wafer. In some embodiments of the present disclosure, the first liquid may be gallium and the first intermediate gas may include GaCl. In some embodiments of the present disclosure, the first liquid may be indium and the second intermediate gas may include InCl. In some embodiments of the present disclosure, the method may further include feeding $PH_3$ gas into the chamber. In some embodiments of the present disclosure, the first layer may have a first thickness between 300 nm and 1200 nm.

In some embodiments of the present disclosure, the method may further include, prior to the contacting, a depositing of a second layer, where the second layer is in thermal contact with the wafer, the second layer is positioned between the wafer and the first layer, and the second layer includes a Group III element and a Group V element. In some embodiments of the present disclosure, the second layer may have a second thickness between 100 nm and 5 μm. In some embodiments of the present disclosure, the second thickness may be between 100 nm and 500 nm. In some embodiments of the present disclosure, the method may further include, after the contacting, a depositing of a third layer on the surface, where the third layer includes a reflective metal.

An aspect of the present disclosure is a device that includes a first layer having a roughened surface and including a Group III element and Group V element, a second layer that includes a reflective metal, and a third layer that includes a Group III element and Group V element, where the second layer is in physical contact with the roughened surface, the third layer has a thickness between 100 nm and 500 nm, and the first layer is positioned between the second layer and the third layer. In some embodiments of the present disclosure, the first layer may include InGaP, and the third layer may include GaAs.

BRIEF DESCRIPTION OF THE DRAWINGS

Some embodiments are illustrated in referenced figures of the drawings. It is intended that the embodiments and figures disclosed herein are to be considered illustrative rather than limiting.

REFERENCE NUMBERS

Figure 1:
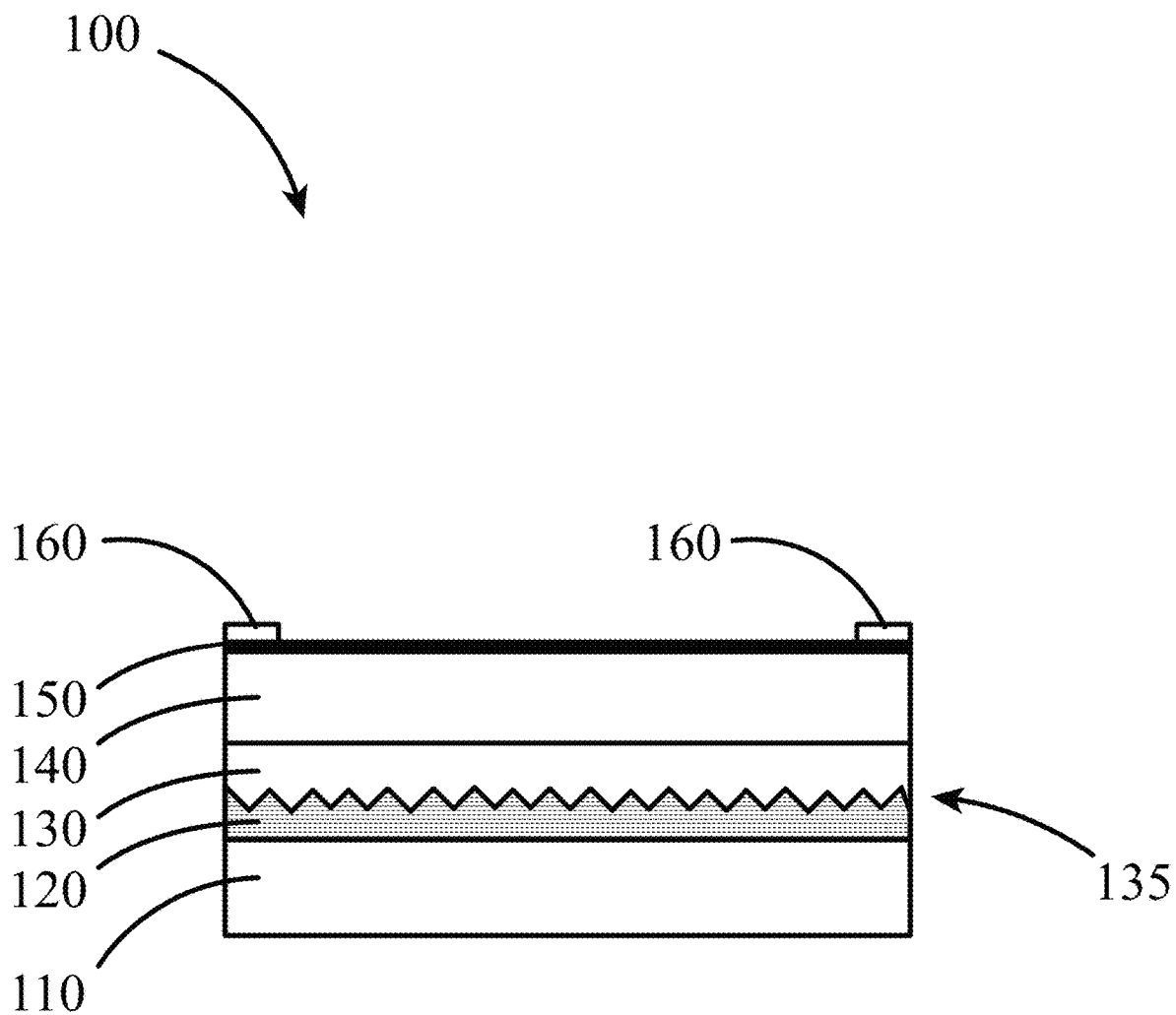
FIG. 1 illustrates a device that includes a roughened back surface, according to some embodiments of the present disclosure.

100 . . . cell
110 . . . third layer
120 . . . first layer
130 . . . second layer
135 . . . roughened surface
140 . . . fourth layer
150 . . . fifth layer
160 . . . sixth layer
200 . . . method
210 . . . roughening
220 . . . first depositing
230 . . . second depositing
240 . . . completing
300 . . . intermediate cell
310 . . . substrate
320 . . . etch stop
400 . . . HVPE reactor
410 . . . chamber
420 . . . supply gas
430 . . . boat
440 . . . liquid
450 . . . intermediate gas
460 . . . wafer
470 . . . etching gas
480 . . . exhaust

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to methods for producing GaAs solar cells grown in an inverted structure, allowing the texturing of a layer (e.g. a back contact and/or a layer acting as a back surface field) of the cell by in situ etching as a final step to growth, where the etching/roughening is performed in the reactor/device used to deposit all or most of individual layers of the cell. This can result in a reduction in the thickness of the absorber layer of the cell. In some embodiments of the present disclosure, the texturing of a layer (e.g. a back contact and/or a layer acting as a back surface field (BSF)) may be performed ex situ (i.e. outside of the deposition reactor), without patterning, using wet etching techniques. In some embodiments of the present disclosure, the methods described herein advance III-V solar cell technology towards a simple, low-cost method, by adding light scattering structures to a surface of a layer acting as a back reflector, which as shown herein, allows thinning of the absorber layer without loss of efficiency.

FIG. 1 illustrates an embodiment of the current disclosure, a cell 100 (e.g. solar cell) that includes a first layer 120, where in some embodiments of the present disclosure, the first layer 120 is included in the cell architecture to function as a back contact and/or a reflector. For example, a first layer 120 may be constructed of at least one of a reflective metal such as gold, silver, copper, nickel, and/or multilayer structures including these metals, dielectrics, and/or air gaps A first layer 120 (e.g. a back contact) may be positioned on a roughened surface 135 of a second layer 130 where the second layer 130 may be provided in the cell architecture to function as at least one of a back contact (e.g. in combination with the first layer 120) and/or a back surface field. In some embodiments of the present disclosure, the second layer 130 may be constructed of, for example, a III-V alloy such as at least one of GaAs, GaInP, GaInAsP, AlAs, AlGaAs, AlGaInP, and/or AlGaInAsP. The first layer 120 (e.g. back contact) may be positioned on a third layer 110 constructed of silicon and/or any other suitable material such as flexible polymers, metal foils, and/or glass, wherein the third layer 110 may function as a "handle" to facilitate easier deposition of other elements of the cell 100. For example, the cell 100 illustrated in FIG. 1 includes a fourth layer 140 positioned between the second layer 130 and a fifth layer 150, where the fourth layer 140 and the fifth layer 150 are included in the cell architecture to function as an absorber layer and a passivation layer, respectively. In some embodiments of the present disclosure, the fourth layer 140 (e.g. absorber layer) may be constructed of GaAs and/or any other III-V semiconductor alloy. In some embodiments of the present disclosure, the fifth layer 150 (e.g. passivation layer) may be constructed of GaInP, AlInP, AlGaInP and/or any other III-V semiconductor alloy. Finally, in some embodiments of the present disclosure, a cell 100 may include one or more sixth layers 160 included in the cell architecture to function as a front contact. In some embodiments of the present disclosure, a sixth layer 160 may be constructed of a metal such as at least one of gold, silver, copper, nickel, and/or alloys and/or multilayer stacks of these metals.

In some embodiments of the present disclosure, the second layer 130 (e.g. back contact and/or back surface field) may have a thickness range between greater than 300 nanometers and 1200 nm. In some embodiments of the present disclosure, a fourth layer 140 may have a thickness between 100 nm and 5 μm. In some embodiments of the present disclosure, a fifth layer 150 may have a thickness between 10 nm and 100 nm. In some embodiments of the present disclosure, a sixth layer 160 may have a thickness between 200 nm and 1000 nm.

Figure 2:
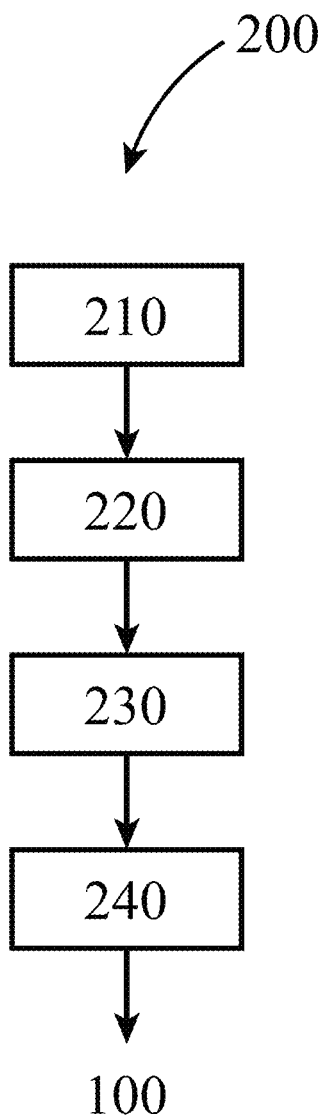
FIG. 2 illustrates a method for making a device similar to that shown in FIG. 1, according to some embodiments of the present disclosure.

FIG. 2 illustrates an exemplary method 200 for manufacturing a cell (e.g. solar cell) similar to that illustrated in FIG. 1. The method 200 may include the roughening 210 of a layer (e.g. the second layer 130 of FIG. 1), such as a back contact and/or back surface field, by in situ etching in a hydride vapor phase epitaxy (HVPE) system and/or ex situ wet etching methods such that the etching roughens the layer, creating a roughened surface (e.g. the roughened surface 135 of FIG. 1), as described herein. The method 200 may then proceed with the depositing 220 of a layer (e.g. the first layer 120 of FIG. 1), such as a back contact and/or reflector onto the roughened surface (e.g. of the second layer of FIG. 1). In some embodiments of the present disclosure, the depositing 220 of a back contact/reflector may be achieved by electroplating a metal (e.g. gold) onto the roughened surface or by sputtering, evaporation, screen printing, and/or any other suitable metal deposition technique. After the depositing 220 (e.g. of a back contact/reflector) onto the roughened surface, the method may proceed with the positioning 230 of the intermediate cell containing the layer having a roughened surface and the layer deposited onto the roughened surface onto a handle (e.g. the third layer 110 of FIG. 1), to facilitate downstream processing for the completing 240 of a fully functional cell 100. For example, the completing 240 may include the photolithography definition of the cell area, deposition of front metal contacts (the sixth layer 160 of FIG. 1), and isolation of individual devices through wet chemical etching. Note that the depositing of front contact (sixth layer 160), passivation layer (fifth layer 150), absorber layer (fourth layer 140), and back contact/back field layer (second layer 130) are deposited in the sequence listed, prior to the roughening 210 of the second layer 130.

Roughening methods: Four methods of etching were used to roughen a surface (e.g. a surface of a back contact) of GaAs solar cells. Referring again to FIG. 1, a second layer 130 constructed of a highly p-doped gallium indium phosphide (GaInP) (to function as a BSF) was etched to produce a roughened surface onto which a reflective metal was deposited. Each etching/roughening method was tested on crystalline layers of highly p-doped GaInP (layer 130 in FIG. 1) grown on a GaAs substrate (layer 140 of FIG. 1) to optimize the roughness achieved on the surface of the p-doped GaInP layers. First, in situ etching was performed in the dynamic HVPE reactor at the National Renewable Energy Laboratory. In some embodiments of the present disclosure, the roughness achieved by in situ etching may be between 20 nm and 200 nm or between 20 nm and 30 nm. This reactor has two chambers that are used to grow alternating layers of GaAs and GaInP that maintain abrupt interfaces. The two-chamber design allowed the sample to be moved from the growth environment into the etching environment quickly.

HVPE grown, p-doped GaInP epilayers (layer 130 in FIG. 1) were roughened/etched to optimize the composition of three wet etchant solutions used for ex situ texturing of the p-doped GaInP layers. The first was a solution of hydrochloric acid (HCl) and water in a 2:1 volumetric ratio. With this etchant, the sample was etched for 45 seconds to achieve even roughness. Second was HCl and acetic acid ($CH_3COOH$) in a 4:3 volumetric ratio, and the sample was etched for 20 seconds. Finally, samples were etched for 20 seconds in a 1:1 volumetric ratio of HCl and phosphoric acid ($H_3PO_4$).

Measurement of roughened GaInP layers (e.g. back contact layers): After the layers were etched, as described above, a Nomarski optical microscope was used to determine if the surface was visibly rough. The GaInP epilayers (layer 130 in FIG. 1) were measured for optical properties as well to determine if the texture effectively scattered light. An Analyzer 1700-RT from n&k Technology was used to measure the surface reflectance of the GaInP layer after texturing. The incident light and detector were perpendicular to the sample surface, so any light scattering off-normal would result in a decrease in the reflectance measured.

Figure 3A:
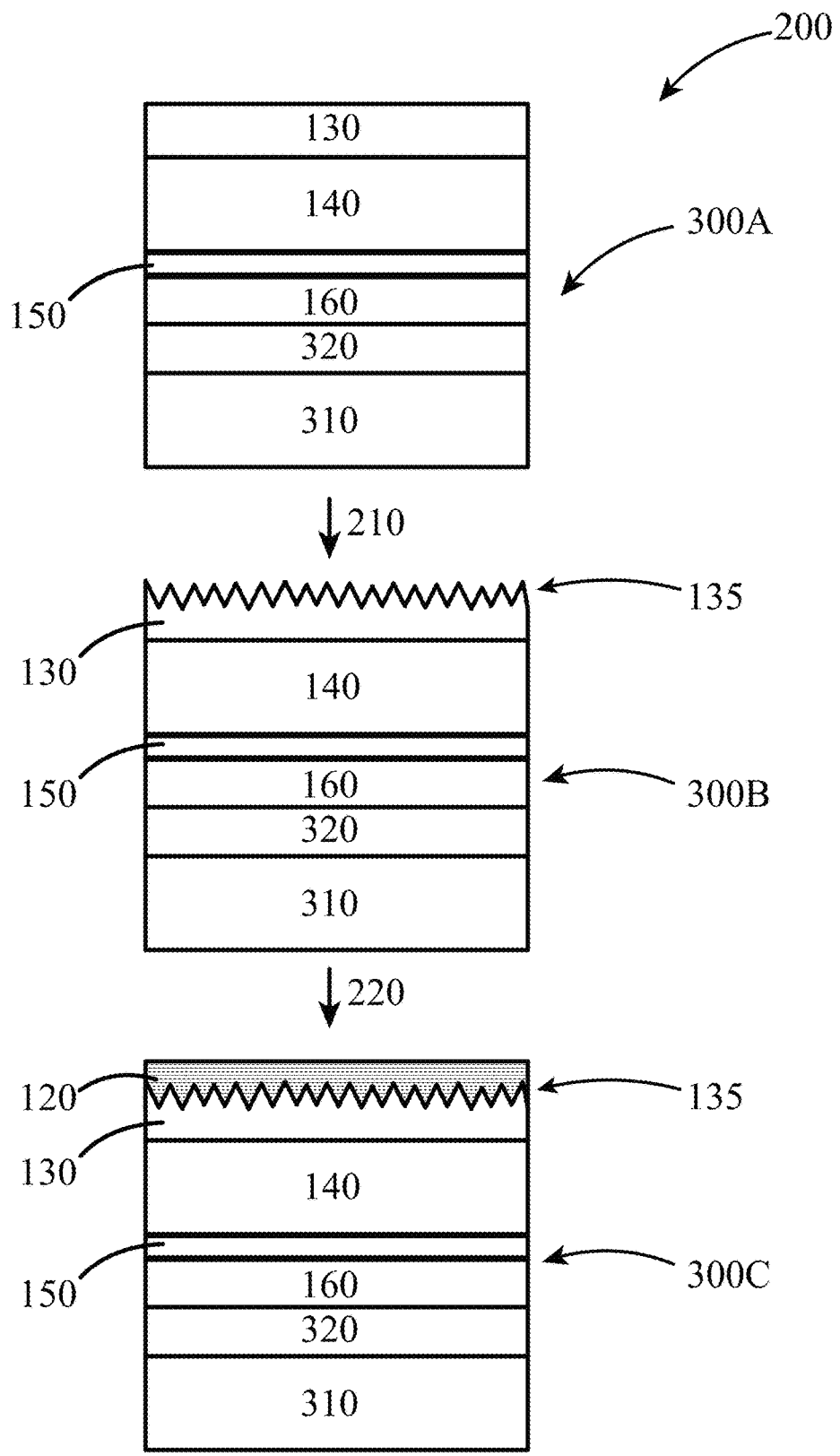
FIGS. 3A and 3B illustrate a solar cell processing diagram for the inverted structures grown in this work, according to some embodiments of the present disclosure. For this example, the cells were grown inverted which allowed the back surface of the cell to be etched before processing.
Figure 3B:
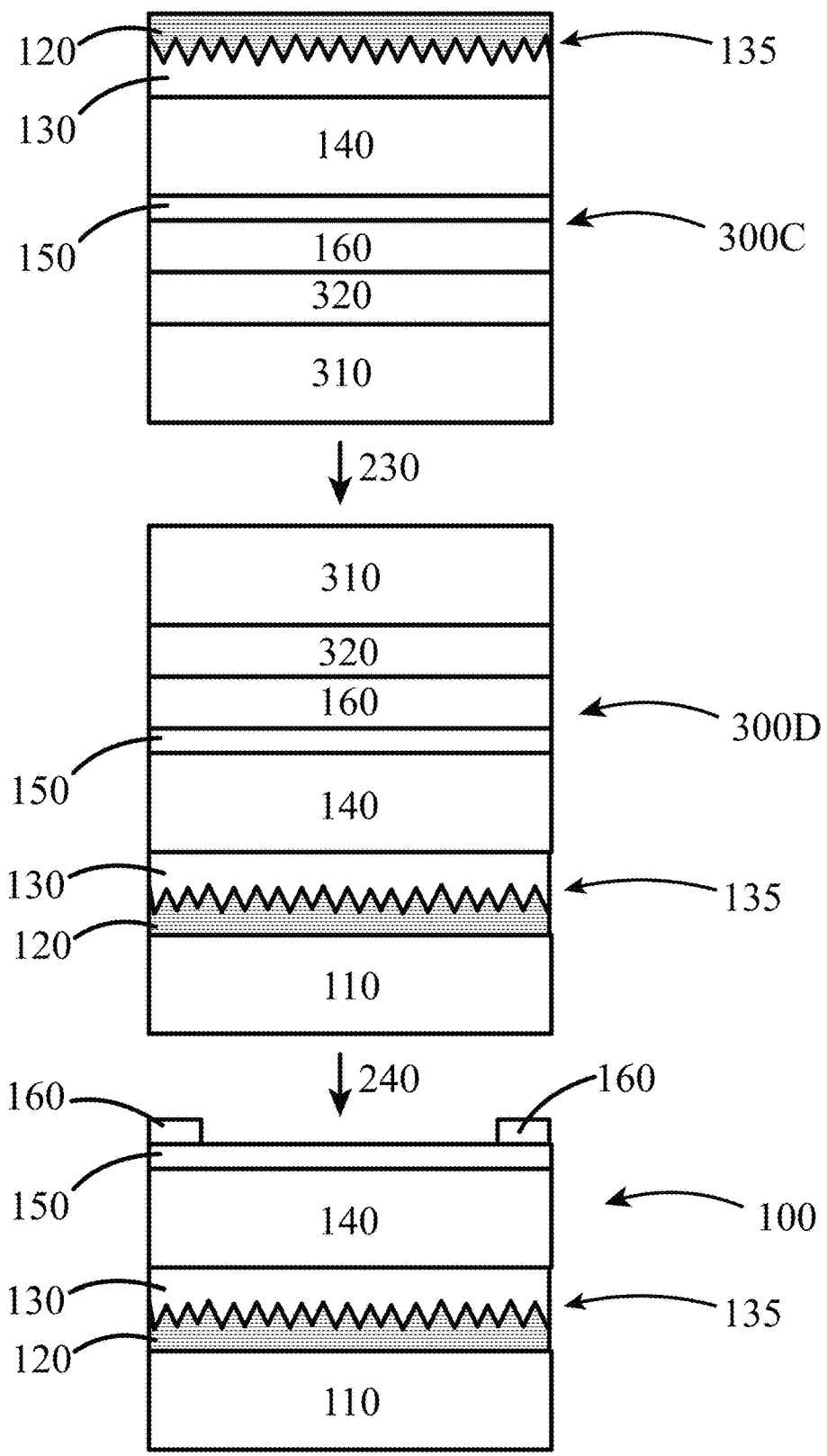

Application of etched back contact layer in solar cells: As mentioned, solar cells used in this work were grown in an inverted geometry. This geometry exposed the back surface of the cell, allowing it to be etched before being fully processed, as shown in FIGS. 3A and 3B. Referring to FIG. 3A, a cell like that shown in FIG. 1 may begin with the sequential deposition of an etch stop 320 onto a substrate 310, a front contact (sixth layer 160) onto the etch stop 320, a passivation layer (fifth layer 150) onto the front contact, an absorber layer (fourth layer 140) onto the passivation layer, and a back contact/BSF (second layer 130) onto the absorber layer, resulting in the forming of a first intermediate cell 300A. With the second layer 130 deposited, its outer surface is exposed and available for roughening 210, resulting in a second intermediate cell 300B having a roughened surface 135. In some embodiments of the present disclosure, the roughening 210 of the second layer 130 may happen simultaneously during the growth (not shown) of the second layer 130 or the roughening 210 of the second layer 130 may happen as a separate step, sequentially after the growth of the second layer 130 is complete.

Once the roughened surface 135 is formed on the second layer 130, the method 200 may proceed with the first depositing 220 of the back contact/reflector layer (first layer 120) resulting in the forming of a third intermediate cell 300C. Referring to FIG. 3B, the method 200 may continue with inverting the third intermediate cell 300C and then proceeding with a second depositing 230 (or transfer) of the third intermediate cell 300C onto a handle (third layer), resulting in a fourth intermediate cell 300D. Finally, the method 200 may continue with the necessary completing steps 240 to produce the final targeted cell 100 illustrated in FIG. 1; e.g. removal of the substrate 310 and etch stop 320, patterning and forming of the front contacts (sixth layer 160).

Figure 4:
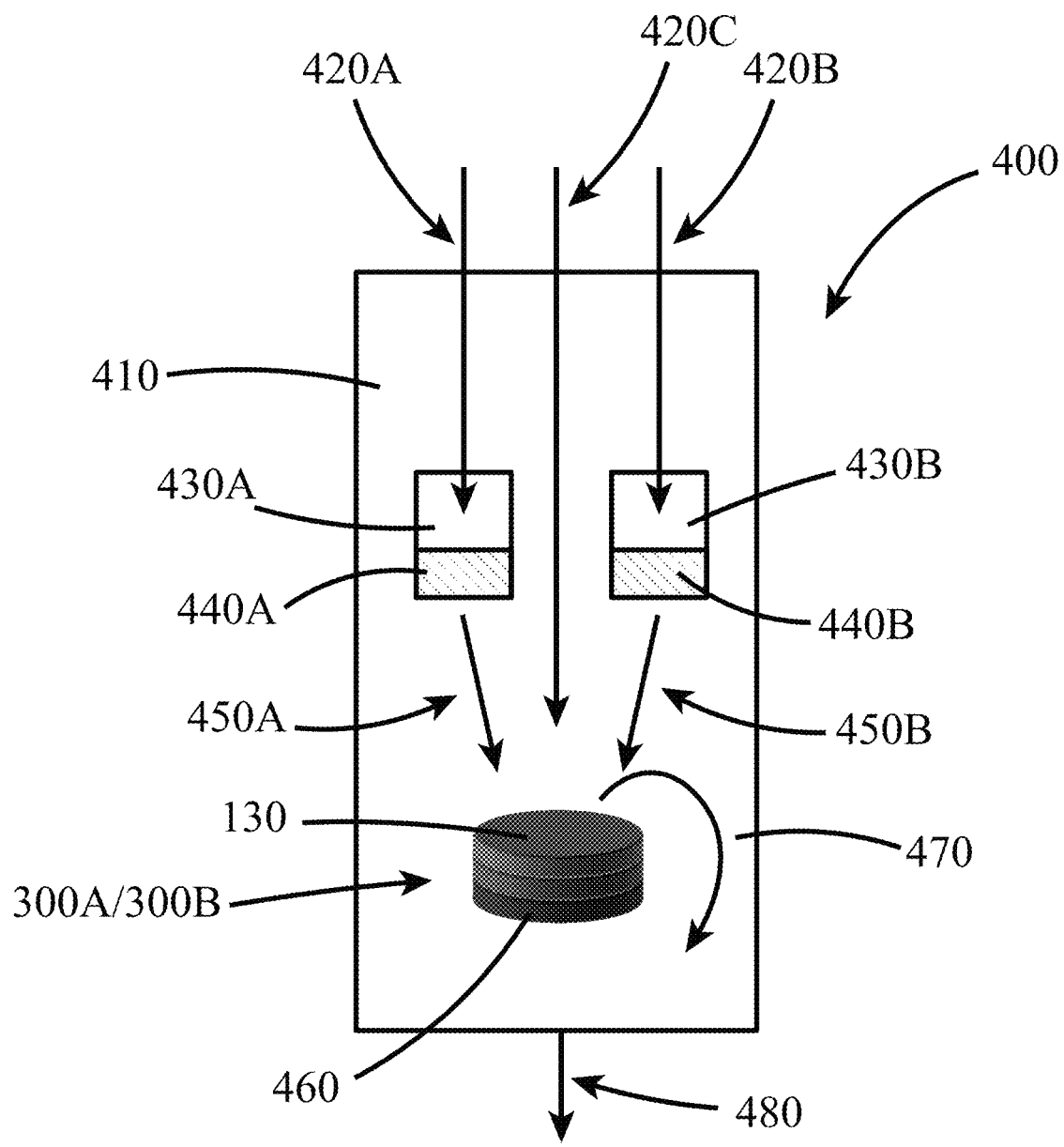
FIG. 4 illustrates an HVPE reactor, according to some embodiments of the present disclosure.

FIG. 4 illustrates an HVPE reactor 400, according to some embodiments of the present disclosure. Details regarding the HVPE reactor used to acquire the experimental data described herein are provided in U.S. Pat. No. 9,824,890, which is incorporated herein by reference in its entirety. The HVPE reactor 400 may include a chamber 410 provided with three gas supplies (420A, 420B, and 420C). The first gas supply 420A may provide HCl directed to a first boat 430A (i.e. container or holder) into which a first liquid 440A is loaded. In some embodiments of the present disclosure, the first liquid 440A may include elemental gallium heated to the liquid state. Thus, the HCl supplied by the first supply gas 420A may react with the gallium positioned in the first boat 430A to produce a first intermediate gas 450A of GaCl and $H_2$. The second gas supply 420B may provide HCl directed to a second boat 430B into which a second liquid 440B is loaded. In some embodiments of the present disclosure, the second liquid 440B may include elemental indium heated to the liquid state. Thus, the HCl supplied by the second supply gas 420B may react with the indium positioned in the second boat 430B to produce a second intermediate gas 450B of InCl and $H_2$. The third gas supply 420C may direct a hydride such $PH_3$ into the chamber 410. Referring again to FIG. 4, the chamber 410 of the HVPE reactor 400 also includes a wafer 460 that may be heated to a target temperature to promote the deposition of the various layers of the cell illustrated in FIGS. 1, 3A, and 3B. FIG. 4 illustrates intermediate cell 300A and/or 300B as shown in FIG. 3A, with the second layer 130 being deposited and/or roughened. More specifically, FIG. 4 illustrates the depositing of a second layer 130 such as a back contact and/or BSF made of InGaP and/or the roughening of an InGaP surface, resulting from the reaction of GaCl, InCl, $PH_3$, and/or $H_2$ gases. The HCl present in this mixture of gases results in the roughening of the surface of the InGaP layer (second layer 130).

In some embodiments of the present disclosure, where the roughening 210 of the second layer 130 is substantially performed during the growing of the second layer 130, the wafer 460 temperature may be maintained at a temperature between 650° C. and 800° C., the ratio of the Group V element precursor (provided by the third supply gas 420C; e.g. $PH_3$) to the Group III element precursor (provided by the first and second supply gases 420A and 420B; e.g. GaCl and/or InCl) may be maintained at between greater than zero and less than or equal to two. The partial pressure of HCL may be between 0.001 Torr and 1.0 Torr. The growing and roughening may be performed for a period of time between 10 seconds and 5 minutes.

In some embodiments of the present disclosure, where the roughening of the second layer 130 is performed substantially after the growing of the second layer 130, the wafer 460 temperature may be maintained at a temperature between 650° C. and 800° C., the ratio of the Group V element precursor (e.g. $PH_3$) to the Group III element precursor (e.g. GaCl and/or InCl) may be maintained at between greater than zero and less than or equal to two, and the partial pressure in the reactor maintained between 0.01 Torr and 1.0 Torr. In some embodiments of the present disclosure, the roughening may be performed for a period of time between 30 seconds and 10 minutes.

The reflectance of HVPE cells like those illustrated in FIG. 1 were measured in an integrating sphere to determine changes in absorbance between the non-etched and etched surfaces without added variability from electrical contacts. These cells were grown with a nominal thickness of 800 nm. A in situ-etched sample was measured and compared to a non-etched cell of the same recipe. The samples were covered with an anti-reflective coating (ARC) to eliminate signal from the initial reflectance from the front surface of the sample, and it was assumed that all light that entered the cell was absorbed, and none was re-emitted. The calculated absorbance was then integrated with the global solar spectrum to obtain a percent change in absorbance of the two cells. The current and voltage characteristics of devices with this structure were also measured to determine the effect of texturing on the overall performance of the solar cell.

Solar cells with thin absorber layers (layer 140 in FIG. 1) of less than 500 nm were also grown in a metal-organic vapor phase epitaxy (MOVPE) reactor so changes in cell performance could be determined with and without etching. Two of the ex situ etching techniques were used to texture the back contacts (layer 130 in FIG. 1) of the cells: $HCl:H_2O$ and $HCl:CH_3COOH$. Current and voltage characteristics were determined and compared to a thin cell that had no texturing. Thicknesses of the cells were measured by mechanical profilometry to account for contributions to the current density from thickness variation, and an ARC was added to accurately determine differences in the quantum efficiency.

Figure 5:
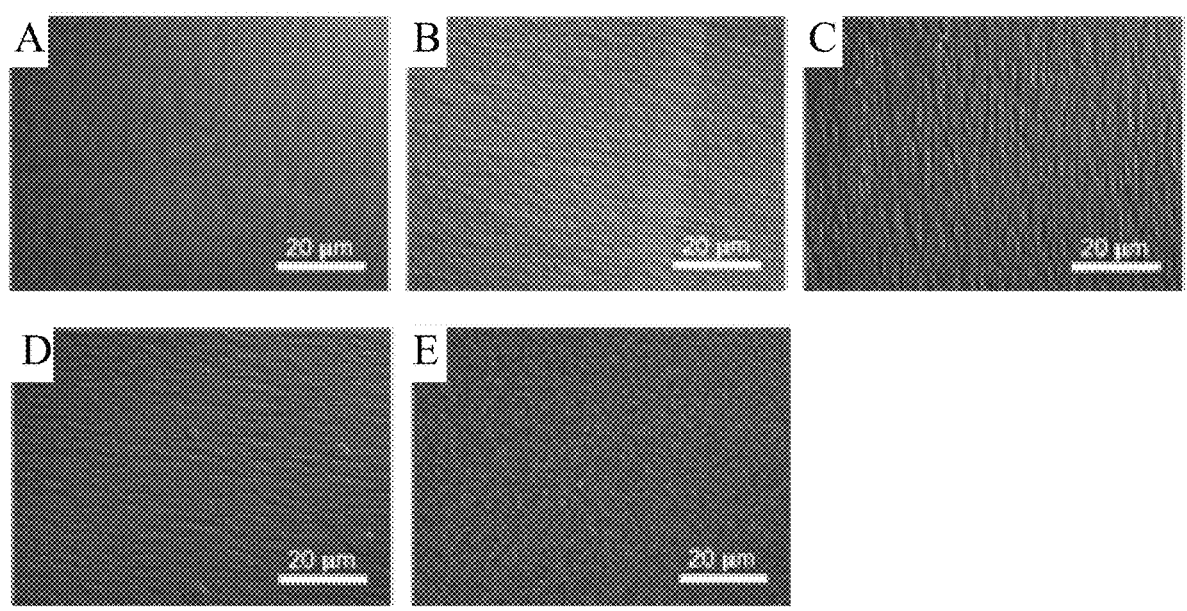
FIG. 5 illustrates Nomarski images of HVPE grown GaInP epilayers textured using the optimized etching conditions, according to some embodiments of the present disclosure. A) Epilayer before roughening, B) roughened with 2:1, $HCl:H_2O$ for 45 s, C) roughened with 4:3, $HCl:CH_3COOH$ for 20 s, D) roughened with 1:1 $HCl:H_3PO_4$ for 20 s, E) etched in situ for 60 s with 30 kPa partial pressure of HCl.
Figure 6:
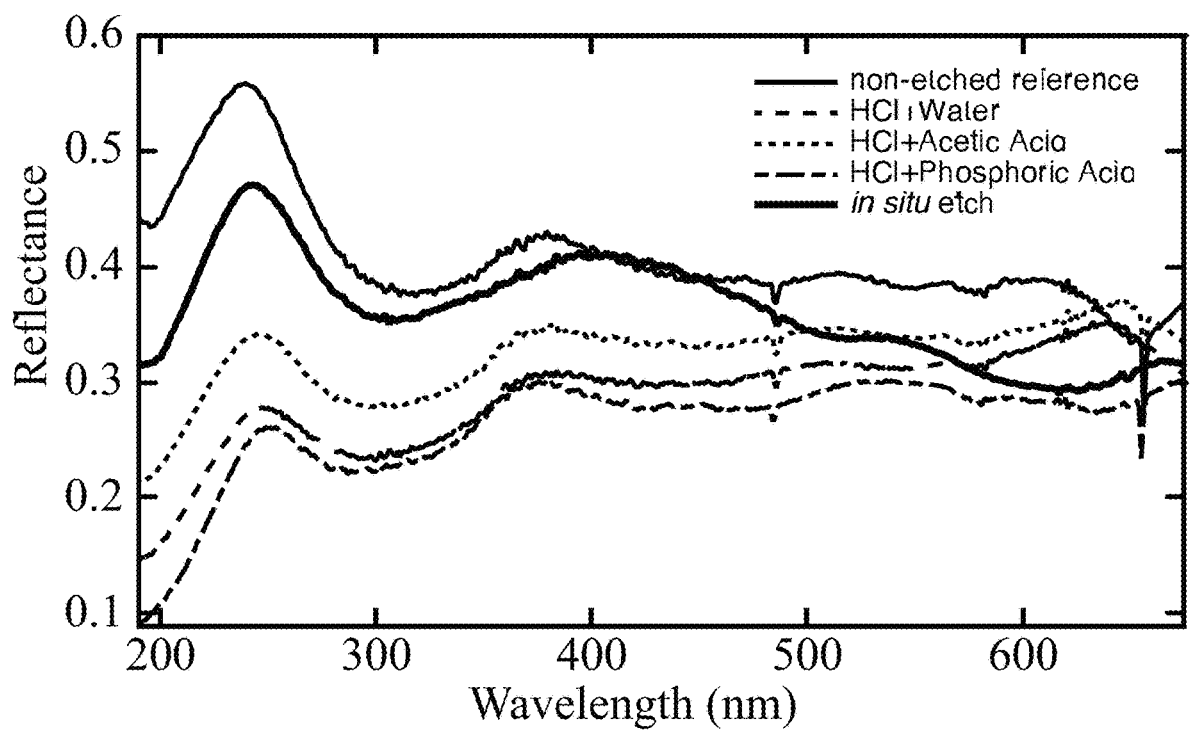
FIG. 6 illustrates reflectance of roughened surfaces compared to an unetched GaInP surface, according to some embodiments of the present disclosure. The reflectance was measured perpendicularly so any light scattered off-normal was not collected, resulting in a decrease in absorbance.

Optimization using GaInP epilayers: FIG. 5 shows Nomarski images of the HVPE grown GaInP epilayers before and after etching using each technique. Even roughening across the sample was achieved with all techniques, and after roughening, the surfaces became visibly hazy to the eye. The degree of haziness and apparent morphology of the texturing varied slightly between etchants. FIG. 6 shows the reflectance of the roughened surfaces before and after etching, measured perpendicular to the surface. The perpendicular measurement results in a decrease in reflectance for any light that is scattered off-normal by the roughened surface.

Figure 7:
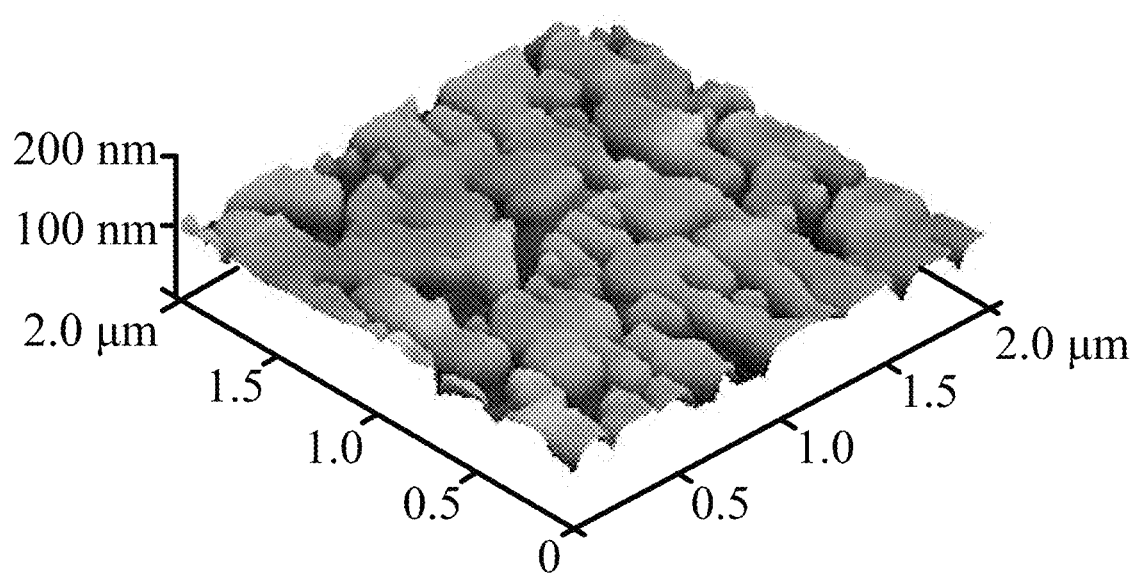
FIG. 7 illustrates representative AFM images of a GaInP epilayer etched in situ with the dynamic HVPE reactor, according to some embodiments of the present disclosure.
Figure 8:
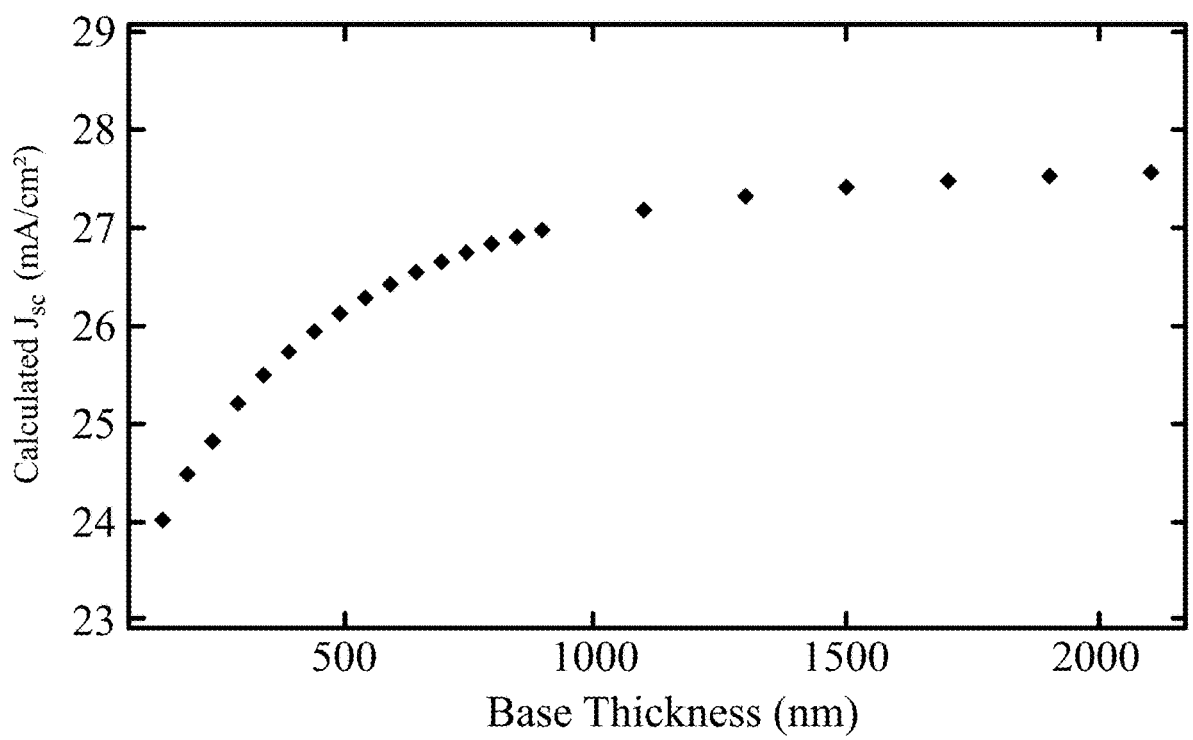
FIG. 8 illustrates estimates of the current density versus thickness trend determined using standard Hovel equations, assuming perfect material, no reflection from the front surface, and perfect reflection off the back surface, according to some embodiments of the present disclosure.

The surface reflectance of the etched samples was lower than that of the unetched surface, as expected. The degree to which the reflectance decreased varied between etchants, suggesting the different morphologies achieved have varying degrees of effectiveness for light scattering. It is also notable that the reflectance was primarily decreased in the low wavelengths, suggesting the texture is most effective at scatting short-wavelength light rather than light that is near the band-edge of GaAs. FIG. 7 shows a representative AFM image of the surface of the in situ etched GaInP layer shown in FIG. 5. The features achieved are approximately 25 nm in height and up to 500 nm in width, which is consistent with the reflectance data at low wavelengths, close to the dimensions of the features. In some embodiments of the present disclosure, the etching conditions used for solar cells grown in the MOCVD were: 15 s in 2:1, HCl:H$_2$O, 10 s in 2:1 HCl:CH$_3$COOH, and 10 s in 3:4 HCl:H$_3$PO$_4$. FIG. 8 shows the expected trend of short-circuit current density (J$_{SC}$) versus thickness when a planar back reflector is used. Values were determined using standard Hovel equations. For this analysis, the cells were assumed to have perfect material, no reflection from the front surface, and perfect reflection from the back surface.

Figure 9:
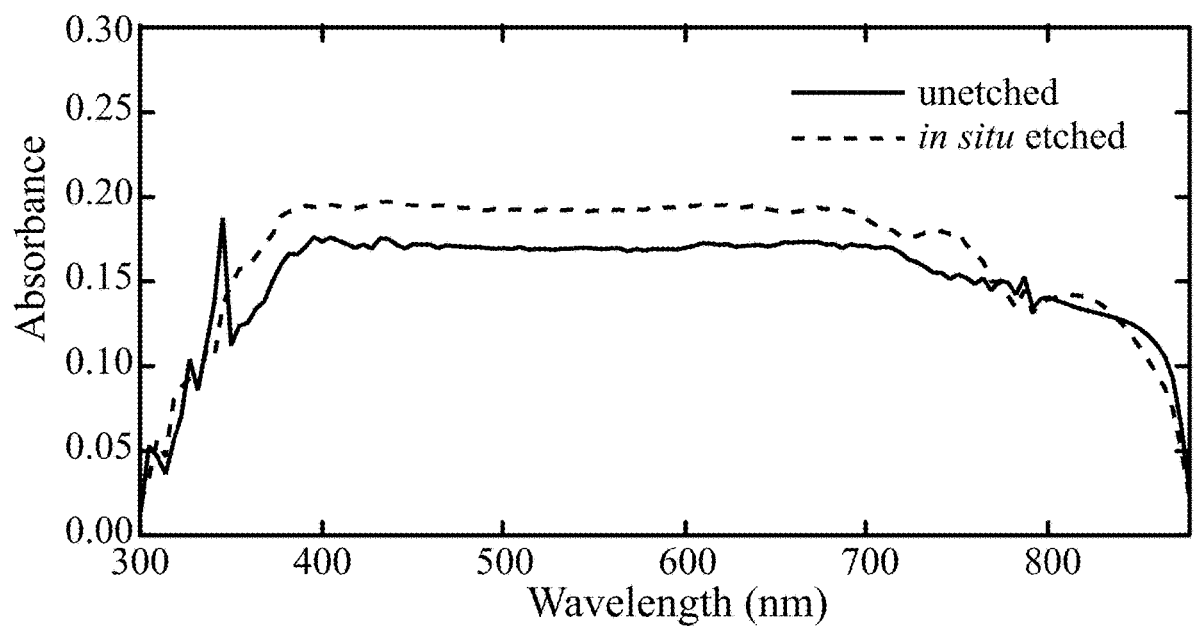
FIG. 9 illustrates absorbance of HVPE cell structures with and without texturing from in situ etching, according to some embodiments of the present disclosure. The reflectance was measured using an integrating sphere and absorbance was calculated using the assumption that no light was remitted from the sample.
Figure 10:
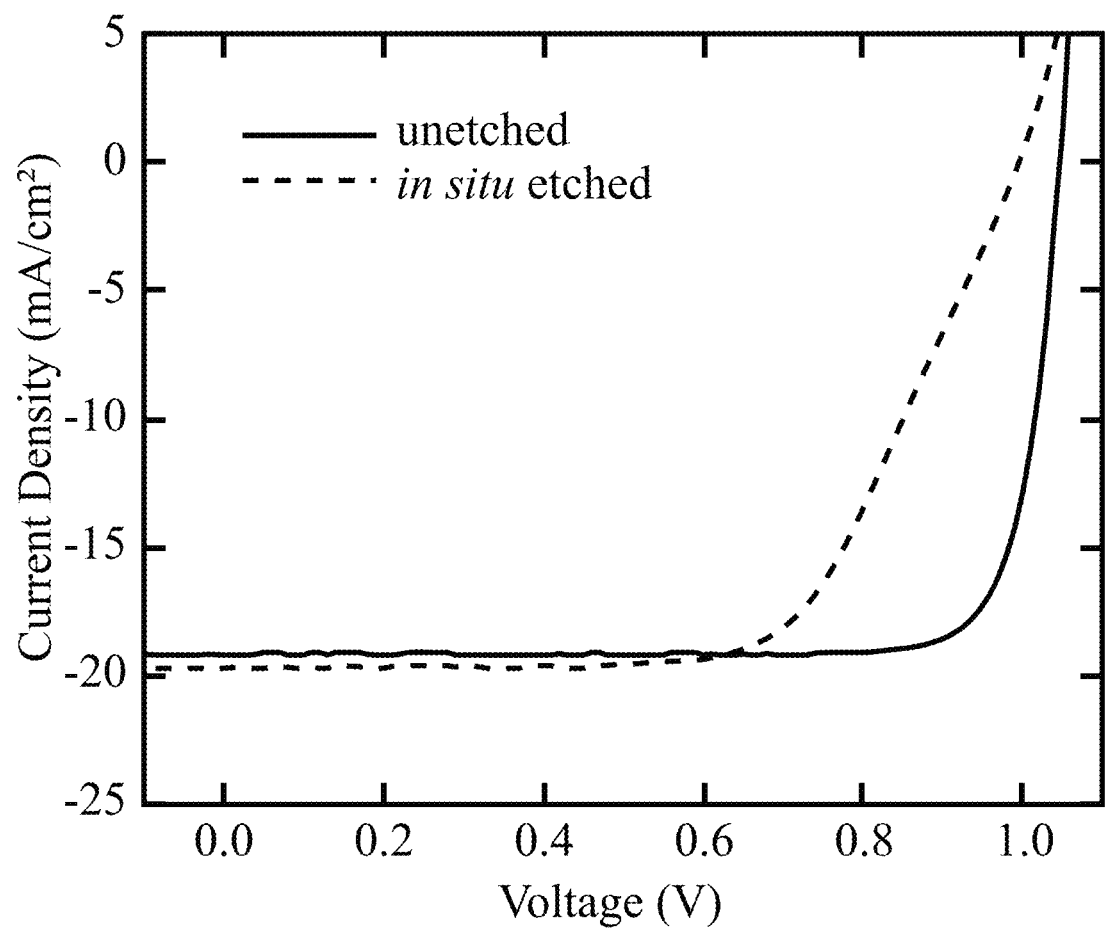
FIG. 10 illustrates current density versus voltage for thin HVPE cells with back texturing from in situ etching and without texturing, according to some embodiments of the present disclosure.

In situ etched cells: FIG. 9 shows the measured absorbance of HVPE solar cell structures measured with an integrating sphere, assuming no light was remitted from the structure. There is a 9.8% increase in absorbance with the etched cell structure; however, the in situ etched cell has a thicker absorber layer than the unetched cell by approximately 50 nm. The difference in thickness accounts for only 5.8% of the absorbance increase observed, indicating up to 4.0% is due to light scattering at the back surface in the etched sample. In a solar cell, an increase in J$_{SC}$ was not observed, as can be seen in FIG. 10. The J$_{SC}$ of the thin cells also did not experience a significant drop from the J$_{SC}$ of 19.85 mA/cm$^2$ observed in an optically thick solar cell of the same structure.

Figure 11:
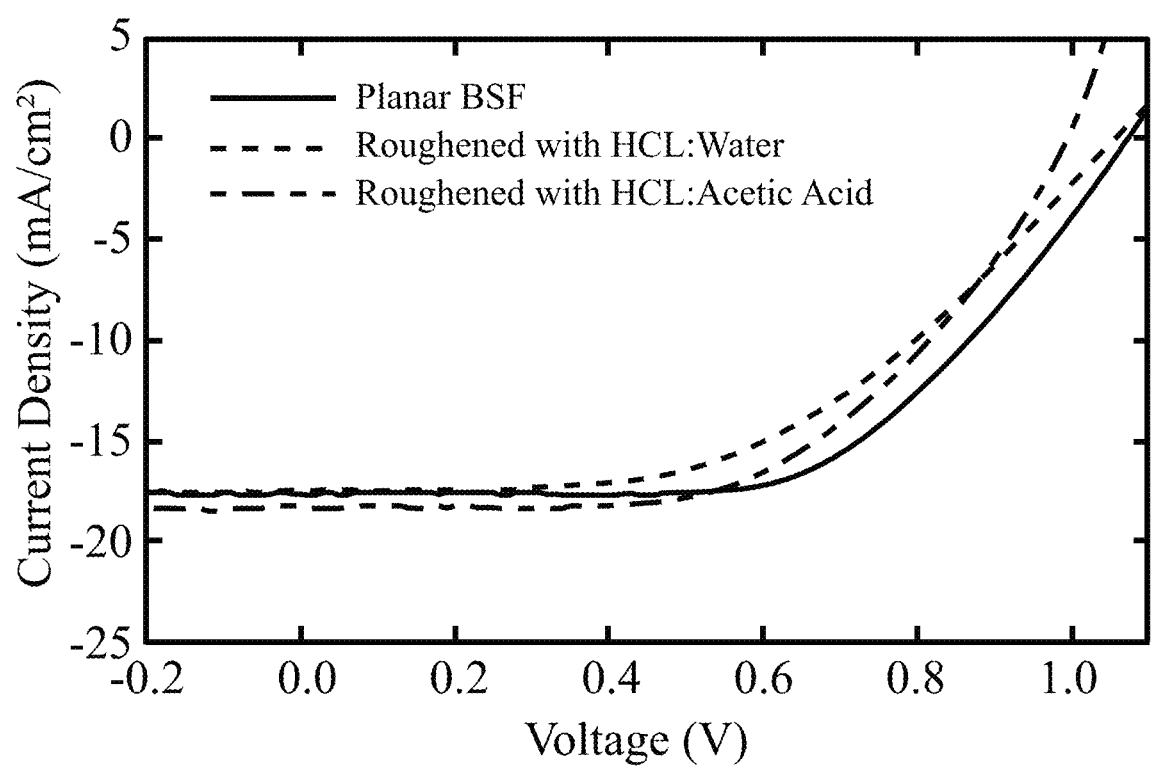
FIG. 11 illustrates current density versus voltage comparison for a thin, MOCVD grown GaAs solar cell with a planar BSF, a BSF textured with HCl:H$_2$O, and a BSF textured with HCl:CH$_3$COOH, according to some embodiments of the present disclosure.

Ex situ etched cells: Variation in J$_{SC}$ was observed between the thin, MOCVD grown cells with etched and non-etched back contact layers (layer 130 in FIG. 1). The thickness of the cells were approximately 475 nm, 440 nm, and 420 nm for the cell with an unetched back contact layer, etched with HCl:H$_2$O, and etched with HCl:CH$_3$COOH, respectively. FIG. 11 shows current density versus voltage for the three devices.

There was a 3.9% increase in J$_{SC}$ (from 17.6 mA/cm$^2$ to 18.3 mA/cm$^2$) between the unetched back contact layer and the back contact etched with HCl:CH$_3$COOH. This increase seems to be due to the texturing and not due to thickness variation because the textured cell is approximately 35 nm thinner. Based on the model shown in FIG. 8, a planar cell with a thickness of 475 nm would have to be increased to 917 nm for a 3.9% increase in J$_{SC}$, showing that the benefit seen from texturing the back contact layer (layer 130 in FIG. 1) has the potential to reduce the thickness of the absorber layer (layer 140) by over 400 nm. There was a 1.0% decrease in J$_{SC}$ between the cell with a non-textured back contact layer and the cell containing a back contact layer textured with HCl:water, but the cell containing the textured back contact layer was also substantially thinner. The difference in thickness translates to an expected 11% loss in absorption, which is proportional to the current density that can be achieved. The cell containing the textured/roughened back contact layer had a significantly smaller loss in current density than expected from the planar cell based solely on the absorber thickness, indicating there was a net benefit to the current density from the texturing.

Four etching techniques were identified as effective methods of roughening the GaInP layers to achieve light scattering in a GaAs solar cell. A potential benefit to the current density for thin MOVPE-grown solar cells was demonstrated after the back contact layer was etched ex situ with solutions of 2:1 HCl:H$_2$O or 2:1 HCl:CH$_3$COOH. Absorbance measurements of HVPE-produced solar cells containing in situ etched back contact layers also showed potential for an increase in current density, despite having no definitive results for devices. For all texturing techniques, a significant increase in series resistance was experienced most likely as a result of the texturing process. The low-cost methods of adding light scattering structures to the back surface of GaAs solar cells have shown potential to save over 400 nm in thickness of the absorber layer.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising, in order:
   depositing onto a surface, by hydride vapor phase epitaxy (HVPE), an absorber layer comprising a Group III element and a Group V element;
   depositing onto the absorber layer, by HVPE, a second layer comprising a Group III element and a Group V element comprising at least one of As or P;
   contacting a surface of the second layer with a gas comprising HCl, at least one chloride precursor of the Group III element of the second layer, and at least one hydride precursor of the Group V element of the second layer, wherein the contacting results in a roughening of the surface of the second layer to a roughness between about 20 nm and about 100 nm; and
   depositing a reflector layer directly onto the roughened surface of the second layer, wherein:
   the absorber layer and the second layer are positioned in thermal contact with a wafer positioned in a chamber of a reactor.

2. The method of claim 1, wherein the roughness is between 20 nm and 30 nm.

3. The method of claim 1, wherein the Group III element of the second layer comprises at least one of gallium, indium, or aluminum.

4. The method of claim 3, wherein the second layer comprises at least one of GaInP, GaInAsP, AlGaInP, or AlGaInAsP.

5. The method of claim 1, wherein the wafer is maintained at a temperature between about 650° C. and about 800° C.

6. The method of claim 1, wherein a partial pressure of the HCl is maintained at between about 0.001 Torr and about 1.0 Torr.

7. The method of claim 1, wherein the contacting is maintained for a period of time between about 10 seconds and about 10 minutes.

8. The method of claim 1, further comprising:
   contacting HCl with a first liquid positioned in a first boat, resulting in the forming of a first intermediate gas; and contacting HCl with a second liquid positioned in a second boat, resulting in the forming of a second intermediate gas, wherein:

the first intermediate gas and the second intermediate gas interact, resulting in the depositing of the second layer on the wafer.

9. The method of claim 8, wherein the first liquid is gallium and the first intermediate gas comprises a first chloride precursor comprising GaCl.

10. The method of claim 8, wherein the first liquid is indium and the second intermediate gas comprises a second chloride precursor comprising InCl.

11. The method of claim 1, wherein the second layer has a first thickness between about 300 nm and about 1200 nm.

12. The method of claim 1, wherein the absorber layer has a thickness between about 100 nm and about 500 nm.

13. The method of claim 1, wherein the reflector layer comprises at least one of gold, silver, copper, or nickel.

* * * * *